United States Patent
Liang

(10) Patent No.: US 10,858,544 B2
(45) Date of Patent: Dec. 8, 2020

(54) CHEMICAL MECHANICAL POLISHING SLURRY AND CHEMICAL MECHANICAL POLISHING PROCESS USING THE SAME

(71) Applicant: TAIWAN SEMICONDUCTOR MANUFACTURING COMPANY LTD., Hsinchu (TW)

(72) Inventor: Wei-Wei Liang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/988,445

(22) Filed: May 24, 2018

(65) Prior Publication Data

US 2019/0359859 A1 Nov. 28, 2019

(51) Int. Cl.
   *C09G 1/18* (2006.01)
   *H01L 21/321* (2006.01)
   *H01L 21/3105* (2006.01)

(52) U.S. Cl.
   CPC ............ *C09G 1/18* (2013.01); *H01L 21/3212* (2013.01); *H01L 21/31053* (2013.01)

(58) Field of Classification Search
   CPC ......... H01L 21/30604; H01L 31/02363; H01L 31/18; H01L 33/10; H01L 21/3212; H01L 21/32134; H01L 21/30617; H01L 21/32115; H01L 21/31053; C09G 1/18; C09G 1/04; C09G 1/00
   USPC .... 216/99, 102, 103, 107, 108; 134/1.1, 1.2, 134/1.3, 3; 438/692, 693
   See application file for complete search history.

(56) References Cited

U.S. PATENT DOCUMENTS

| | | | | |
|---|---|---|---|---|
| 5,993,686 | A | * | 11/1999 | Streinz ............... H01L 21/3213 252/79.3 |
| 8,591,763 | B2 | * | 11/2013 | Li ............................. C09G 1/02 106/3 |
| 9,434,859 | B2 | * | 9/2016 | Pallikkara Kuttiatoor .................. C09D 5/00 |
| 2003/0066760 | A1 | * | 4/2003 | Matsui ...................... C25F 3/00 205/640 |
| 2005/0090109 | A1 | * | 4/2005 | Carter ...................... C09G 1/02 438/692 |
| 2007/0224822 | A1 | * | 9/2007 | Li ............................. C09G 1/02 438/692 |
| 2012/0238094 | A1 | * | 9/2012 | Minami ................ B24B 37/044 438/693 |
| 2013/0224947 | A1 | * | 8/2013 | Noguchi ........... H01L 21/76801 438/624 |

(Continued)

OTHER PUBLICATIONS

Sivala, M.R., Devineni, S.R., Golla, M. et al., A heterogeneous catalyst, SiO2—ZnBr2: An efficient neat access for α-aminophosphonates and antimicrobial activity evaluation, J Chem Sci (2016) 128: 1303.

(Continued)

*Primary Examiner* — Lan Vinh
(74) *Attorney, Agent, or Firm* — WPAT, P.C., Intellectual Property Attorneys; Anthony King

(57) ABSTRACT

The present disclosure provides a chemical mechanical polishing (CMP) slurry including a Lewis acid which is in dissolved form, and a chemical mechanical polishing (CMP) process using such CMP slurry. The present disclosure further provides an abrasive-free chemical mechanical polishing (CMP) slurry including a Lewis acid which is in dissolved form.

7 Claims, 4 Drawing Sheets

(56) References Cited

U.S. PATENT DOCUMENTS

2014/0073140 A1* 3/2014 Takahashi ....... H01L 21/823871
438/754
2015/0083689 A1* 3/2015 Pallikkara Kuttiatoor ..................
C09D 5/00
216/38

OTHER PUBLICATIONS

Christian Dschlein, Jonathan O. Bauer, and Carsten Strohmann, From the Selective Cleavage of the Si—O—Si Bond in Disiloxanes to Zwitterionic, Water-Stable Zinc Silanolates, Angew. Chem. Int. Ed. 2009, 48, 8074-8077.

* cited by examiner

CHEMICAL MECHANICAL POLISHING SLURRY AND CHEMICAL MECHANICAL POLISHING PROCESS USING THE SAME

BACKGROUND

Chemical mechanical polishing (CMP), also called chemical mechanical planarization, is a process commonly used in the semiconductor manufacturing industry for surface polishing/planarization of a wafer, such as a silicon wafer.

The CMP process generally uses a CMP slurry containing an abrasive, in conjunction with a polishing pad and a retaining ring. During the CMP process, the polishing pad and the wafer are pressed together by a dynamic polishing head and held in place by the retaining ring. The dynamic polishing head is rotated with different axes of rotation (i.e., not concentric), such that the wafer is rotated relative to the polishing pad. The relative rotation between the wafer and the polishing pad removes a portion of a material of the wafer, and tends to even out any irregular topography of the wafer, making the wafer flat or planar.

In the aforementioned CMP process, the content of the CMP slurry and/or the content of the abrasive significantly affect polishing rate of the CMP process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
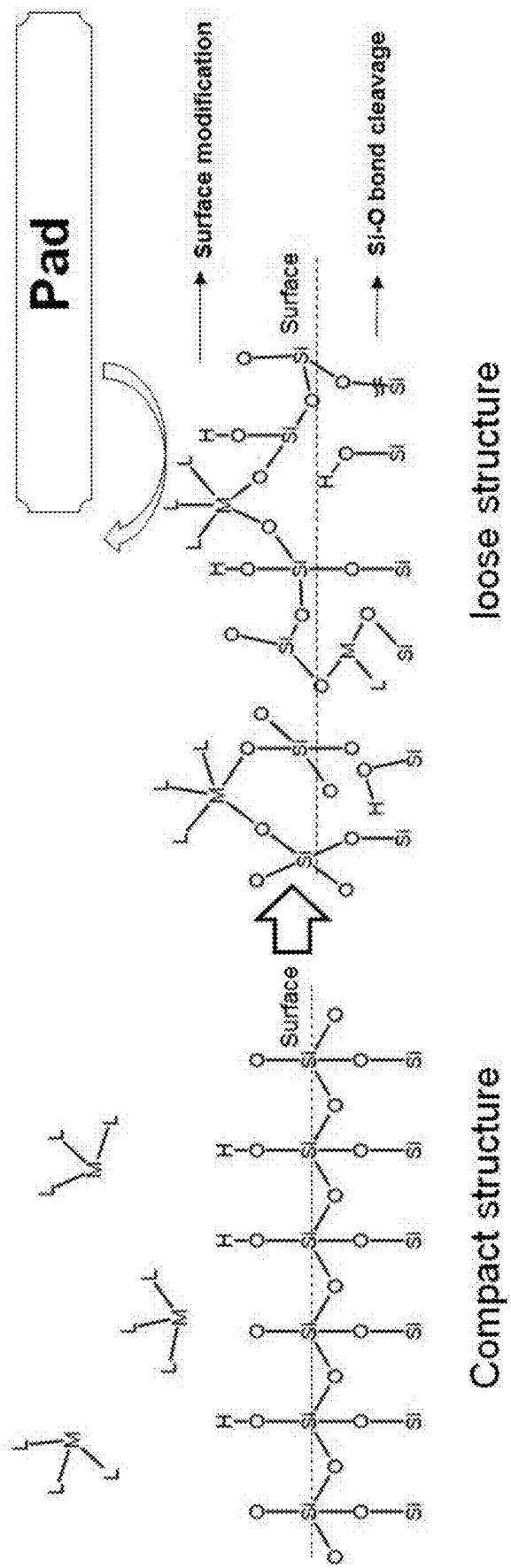
FIG. 1 is a schematic view of a proposed mechanism of a chemical mechanical polishing (CMP) process using a CMP slurry according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In a comparative example, a CMP slurry includes an abrasive, such as $ZrO_2$, $CeO_2$, $Al_2O_3$, and $TiO_2$ particles. According to a hypothesis, such abrasive has Lewis acid characteristics, which forms a bond with an O atom of a Si—O bond of a silicon oxide wafer, and thus breaks the Si—O bond. Accordingly, a portion of the material of the wafer can be removed. However, the abrasive which remains solid in the slurry tends to precipitate with a short life time, and may cause severe pollution to the environment after the CMP process. Besides, the compatibility of the abrasive with the other components of the CMP slurry is also an issue of concern.

To address at least a portion of the above concerns, the present disclosure provides a CMP slurry including a Lewis acid which is in dissolved form. Such CMP slurry may be used without an abrasive. The present disclosure also provides an abrasive-free chemical mechanical polishing (CMP) slurry including a Lewis acid which is in dissolved form, and wherein the abrasive-free chemical mechanical polishing slurry is abrasive-free.

In some embodiments of the present disclosure, the term "substrate" refers to a substance which has a nonflat or nonplanar surface, thus needs to be polished or planarized. For example, the substrate may be a wafer to be polished by the CMP process, but is not limited thereto. In the aforementioned condition, the term "substrate" is also called "substrate to be polished." However, the term "substrate" may also refer to the substrate during the CMP process, or the substrate after the CMP process.

In some embodiments, the substrate may be selected from a group including silicon substrates, TFT-LCD glass substrates, GaAs substrates, and other substrates associated with integrated circuits, thin films, multiple level semiconductors, and wafers. Further, the substrate may include a semiconductor region and a silicon region at the same time. The semiconductor region may include at least one semiconductor material different from silicon. In some embodiment, the semiconductor region is a channel region for a metal-oxide-semiconductor (MOS) field effect transistor (FET), but the present disclosure is not limited to this.

In some embodiments of the present disclosure, the term "chemical mechanical polishing (CMP) slurry" refers to a slurry used in a CMP process. The CMP slurry contacts and reacts with a surface of a to-be-polished substrate (e.g., a wafer) during the CMP process, thus removing a portion of the material of the substrate and planarizing the surface of the substrate.

In some embodiments of the present disclosure, the CMP slurry includes the Lewis acid. The term "Lewis acid" refers to a chemical species that contains an empty orbital, and the empty orbital is capable of accepting an electron pair from another chemical species (i.e., a Lewis base). In some embodiments, the Lewis acid of the present disclosure may be a covalent compound containing such empty orbital. However, in other embodiments, the Lewis acid of the present disclosure may be an ionic compound which, after dissociation, provides an anion containing such empty orbital. Correspondingly, the term "Lewis base" is the chemical species that has a filled orbital containing an electron pair. The electron pair is not involved in bonding but may form a dative bond (i.e., coordinate bond) with the Lewis acid. The Lewis acid accepts the electron pair from the Lewis base, thus jointly forms a "Lewis adduct" with the Lewis base.

In some embodiments of the present disclosure, when describing the state of the Lewis acid, the term "in dissolved form" means that the Lewis acid is dissolved (e.g., in a solvent). For example, the CMP slurry of the present disclosure may include a solvent, and the Lewis acid is dissolved in the solvent, thus is "in dissolved form." Accordingly, the Lewis acid in the present disclosure is preferably soluble in the solvent. For example, a solubility of the Lewis acid in the disclosure is greater than 0.1 g per 100 mL of the solvent, preferably greater than 1 g per 100 mL of the solvent, and more preferably greater than 10 g per 100 mL of the solvent or even greater than 100 g per 100 mL of the solvent.

In some embodiments of the present disclosure, the solvent may be any liquid used in the CMP process, which is able to dissolve, while not reacting with, the Lewis acid. For example, the solvent includes, but is not limited to, water (e.g., deionized water or ultra-pure water) and aqueous solution.

In some embodiments of the present disclosure, the Lewis acid is represented as $ML_n$, in which "M" is a metal or cation, "L" is an electron withdrawing anion or an electron withdrawing ligand, and "n" is an arbitrary number. Preferably, "n" is a natural number, an integer greater than 0. In some embodiments, "M" includes, but is not limited to, $Na^+$, $K^+$, $Al^{3+}$, $Zn^{2+}$, $Sn^{2+}$, $Ni^{2+}$ and $Ti^{4+}$. "L" includes, but is not limited to, mesylate anion, tosylate anion, triflate anion, nitrate anion, perchlorate anion, cyanide anion, tetrafluoroborate anion, hexafluorophosphate anion, hexafluorosilicate anion, phosphate anion, thiocyanate anion and halide anions (i.e. $F^-$, $Cl^-$, $Br^-$, $I^-$). For example, the Lewis acid represented as $ML_n$ includes, but is not limited to, zinc acetate, zinc bromide, tin fluoride (e.g., tin(II) fluoride, tin(IV) fluoride) and zinc hexafluorosilicate.

While not willing to be bound by any theory, it is believed that the Lewis acid may accept (with its empty orbital) an electron pair from an atom of a material of the substrate. Please refer to FIG. 1, which is a schematic view of a proposed mechanism of a CMP process using the CMP slurry. For example, during the CMP process of a silicon oxide ($SiO_x$) wafer, the Lewis acid may accept the electron pair from an O atom of silicon oxide (e.g., "—Si—O—Si—" structure), forming a dative bond between the Lewis acid and the O atom (e.g., forming "—Si—O-Lewis acid" and "Si—"). The formation of the dative bond between the Lewis acid and the O atom results in breaking of a Si—O bond, promoting hydrolysis of silicon oxide. Consequently, polishing rate of the CMP process is increased.

In other words, when reacting with the —Si—O—Si— structure, the Lewis acid competes against the Si atom to bond with the O atom. That is, the Lewis acid has an affinity with the O atom of the Si—O bond, and the affinity is stronger than a bond strength of Si—O bond.

Similarly, in a case that the substrate is a silicon nitride ($Si_3N_4$) wafer, the Lewis acid competes against the Si atom to bond with the N atom. That is, the Lewis acid has an affinity with the N atom of the Si N bond, and the affinity is stronger than a bond strength of Si—N bond.

The "affinity" of the Lewis acid with the O atom of the Si—O bond may be measured by adding the Lewis acid with a positive charge moiety (e.g., quaternary ammonium, phosphonium, etc) to a surface of a substrate containing the Si—O bond. Once the Lewis acid can attach onto the substrate, the surface potential of the substrate would be increased and can be determined by zeta potential measurement.

In some embodiments of the present disclosure, the CMP slurry is abrasive-free (i.e., contains no abrasive). The term "abrasive" may refer to particles which are not soluble in the CMP slurry and/or not dissolved in the CMP slurry. For example, the abrasive includes, but is not limited to, $ZrO_2$. $CeO_2$, $Al_2O$, and $TiO_2$ particles.

In other words, the CMP slurry according to some embodiments of the present disclosure consists of only one phase of matter. For example, the CMP slurry is preferably in a liquid phase (e.g., a liquid solution). The solvent of the CMP slurry may dissolve all components of the CMP slurry, forming a liquid solution.

In some embodiments of the present disclosure, a mass fraction of the Lewis acid in the CMP slurry is preferably not greater than the solubility of the Lewis acid in the CMP slurry, thus the Lewis acid can be completely dissolved. However, it is not to be taken as a limitation. Preferably, the mass fraction of the Lewis acid in the CMP slurry is about 10 ppm to about 50 wt %, preferably about 50 ppm to about 25 wt %, and more preferably about 200 ppm to about 20 wt %. In some embodiments, a concentration of the Lewis acid may be from 0.005 g to 20 g in 100 ml (or 100 g) of the CMP slurry. While not willing to be bound by any theory, it is believed that the appropriate mass fraction of the Lewis acid can enhance the polishing efficiency and/or improve the planarization performance of the CMP slurry.

In some embodiments, the CMP slurry of the present disclosure may further include other components, such as those ingredients commonly used in CMP slurries (e.g., oxidant, pH-adjuster, surfactant, water-soluble lubricant, etc.). For example, the CMP slurry of the present disclosure may include at least an oxidant, at least a pH-adjuster, at least a surfactant, and/or at least a water-soluble lubricant.

In some embodiments, the substrate may include the oxidant for oxidizing the material of the substrate, and/or the metal disposed thereon. For example, the oxidant may include, but is not limited to, hydrogen peroxide, superoxide, dioxygenyl, ozone, ozonide, peroxide, fluorine, chlorine, chlorite, chlorate, perchlorate, halogen compounds, nitric acid, nitrate, hypochlorite, hypohalite, chromium trioxide, pyridinium chlorochromate, chromate, dichromate, chromium compound, potassium permanganate, permanganate, sodium perborate, nitrous oxide, 2,2'-dipyridisulfide, lead dioxide ($PbO_2$), manganese dioxide ($MnO_2$), copper oxide (CuO), ferric trichloride ($FeCl_3$). (perchloric acid, $HClO_4$), ferric nitrate ($Fe(NO)_3$), sulfate and potassium persulfate ($K_2S_2O_8$).

In some embodiments, the pH-adjuster is used for providing an acidic environment or an alkali environment. That is, the pH-adjust may be an acid or an alkali. For example, the acid may include, but is not limited to, glycine, citric acid, lactic acid, tartaric acid, succinic acid, acetic acid, malonic acid, oxalic acid, poly acrylic acid, carboxylic acid, nitric acid, sulfuric acid and sulfonic acid. For example, alkali may include, but is not limited to, potassium hydroxide, sodium hydroxide, ammonium hydroxide ($NH_4OH$), a quaternary ammonium hydroxide salt and a combination thereof. The quaternary ammonium hydroxide salt may include, but is not limited to, tetramethylammonium hydroxide (TMAH), tetraethylammonium hydroxide (TEAH), and choline hydroxide.

In some embodiments, the surfactant may be anionic or non-ionic. For example, the surfactant may include at least one of lauryl myristyl alcohol series, methyl-oxirane polymer series, whose hydrophile lipophile balance (HLB) may be 12 or higher, ethylenediamine, ethoxylated and propoxylated alcohol series, 2-methyloxirane, oxirane series, polyethylene glycol, and polysorbate series. The surfactant may further include at least one of benzalkonium chloride, alkyl benzene sulfonate, phemerol chloride, ammonium lauryl sulfate, sodium lauryl ether sulfate, sodium myreth sulfate, dioctyl sodium sulfosuccinate, perfluorooctanesulfonate, perfluorobutanesulfonate, linear alkylbenzene sulfonate, sodium stearate, sodium lauroyl sarcosinate, cetyl trimethylammonium bromide, cetyl trimethylammonium chloride, perfluorononanoate, perfluorooctanoate, octenidine dihydrochloride, 5-bromo-5-nitro-1,3-dioxane, dimethyldioctadecylammonium chloride, cetrimonium bromide, dioctadecyldimethylammonium bromide, octaethylene glycol monododecyl ether, glyceryl laurate, and polyethoxylated tallow amine.

In some embodiments, the water-soluble lubricant may be ethylene glycol, siloxane, vinyl alcohol, acrylic acid and its polymer form.

The CMP slurry of the present disclosure may be used to polish the substrate selected from a group including silicon substrates, TFT-LCD glass substrates, GaAs substrates, and other substrates associated with integrated circuits, thin films, multiple level semiconductors, and wafers. In particular, the CMP slurry of the present disclosure has been found to exhibit excellent polishing performance when used to polish a silicon substrate, such as silicon oxide substrate or silicon nitride substrate.

Figure 2A:
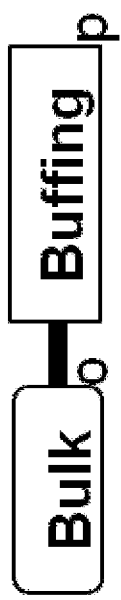
FIGS. 2A, 2B, 2C, 2D, and 2E are flow diagrams illustrating a CMP process including one or more bulk steps and/or one or more buffing steps.
Figure 2B:
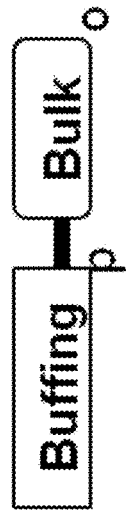
Figure 2C:
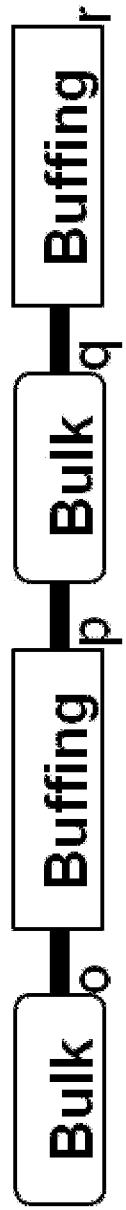
Figure 2D:
Figure 2E:
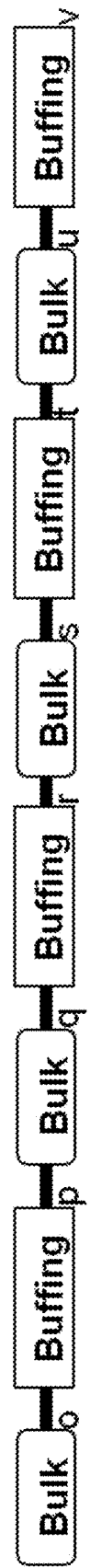

The CMP slurry of the present disclosure may be used in a bulk step or a buffing step of the CMP process. However, the CMP slurry of the present disclosure is preferably used in the buffing step. In some embodiments, the CMP process may use CMP slurry containing abrasive in the bulk step, and may use the CMP slurry of the present disclosure in a buffing step. Please refer to FIGS. 2A to 2E, are flow diagrams illustrating a CMP process. The "o", "p", "q", "r", "s", "t", "u" and "v" in FIGS. 2A to 2E each represents an integer equal to or greater than 0. As shown in FIGS. 2A and 2B, such CMP process may start with a bulk step or a buffing step. Further, the CMP process may include a plurality of bulk steps and a plurality of the buffing steps. The bulk steps and the buffing steps may be in any arrangement, which is not limited in the present disclosure. When the CMP process includes more than one buffing steps, each buffing step may use the CMP slurry of the present disclosure. Alternatively, some of the buffing steps may use another CMP slurry, such as those containing abrasive. Besides, the CMP slurry may be used in a various types of CMP process, which include but are not limited to pre-metal dielectric (PMD) CMP process, inter-metal dielectric (IMD) CMP process, inter-layer dielectric (ILD) CMP process and shallow trench isolation (STI) CMP process.

In some embodiments, the present disclosure further provides a chemical mechanical polishing (CMP) process, which includes providing a silicon substrate; and polishing the silicon substrate with the aforementioned CMP slurry.

In some embodiments of the present disclosure, the term "chemical mechanical polishing (CMP) process" refers to a process of smoothing a surface of a silicon substrate with the combination of chemical and mechanical forces, which is also called "chemical mechanical planarization process." The CMP process generally involves polishing/planarizing the surface of the silicon substrate using a CMP slurry in conjunction with a polishing pad and a retaining ring. In the CMP process, the silicon substrate is placed on the polishing pad in a face-to-face manner. The polishing pad and the silicon substrate are pressed together by a dynamic polishing head and held in place by the retaining ring. The silicon substrate is driven by the dynamic polishing head to rotate relative to the polishing pad, while the CMP slurry is supplied on the polishing pad and between the polishing pad and the silicon substrate. Thus, a portion of the material of the silicon substrate may be removed, and a surface of the substrate is consequently polished/planarized.

In some embodiments of the present disclosure, a material of the silicon substrate is $Si_3N_4$ or $SiO_x$, and x is greater than 0 but not greater than 2. For example, the silicon substrate may be a silicon nitride ($Si_3N_4$) wafer, or a silicon oxide ($SiO_x$) wafer. The silicon nitride wafer and the silicon oxide wafer may be formed by chemical vapor deposition (CVD) or physical vapor deposition (PVD), but are not limited thereto.

The following examples are given for the purpose of illustration only and are not intended to limit the scope of the present invention The CMP slurry of Examples E1 to E3 and Comparative Example C1 are provided. The CMP slurry contains deionized water and 0.1 wt % Lewis acid (as shown in Table 1 below for E1 to E3) or without Lewis acid (but adding equal amount of deionized water, C1). Each of the CMP slurries of E1 to E3 and C1 is used to polish a respective plasma-enhanced tetraethyl-orthosilicate (PETEOS) oxide (OX) wafer, and the removal rate (i.e., polishing rate) thereof is recorded in Table 1 below. The polishing condition generally follows the specified CMP tool recipe and condition for 8" and 12" wafer, as shown in Table 2 below.

TABLE 1

The Lewis acid types and removal rates of E1 to E3 and C1

| Examples | Lewis acid | PETEOS OX removal rate (Å/min) |
|---|---|---|
| E1 | Zinc acetate | 48 |
| E2 | Zinc bromide | 57 |
| E3 | Tin(II) fluoride | 36 |
| C1 | X (DI $H_2O$) | 6 |

TABLE 2

CMP tool recipe and condition for 8" and 12" wafer

| | |
|---|---|
| Membrane Down Pressure | 2~7 psi |
| Retaining Ring Pressure | 3~8 psi |
| Intertube Pressure | 2~7 psi |
| Slurry Flow | 20~200 ml/min |

TABLE 2-continued

CMP tool recipe and condition for 8" and 12" wafer

| Rotation Speed | 5~150 rpm |
| Diamond Disk Pressure | Arbitrary psi |

Referring to Table 1 above, the CMP slurry including the Lewis acid (e.g., the CMP slurry of E1 to E3) presents improved removal rate than the CMP slurry without the Lewis acid (e.g., the CMP slurry of C1). For example, the removal rate is preferably greater than 20 Å/min.

Figure 3:
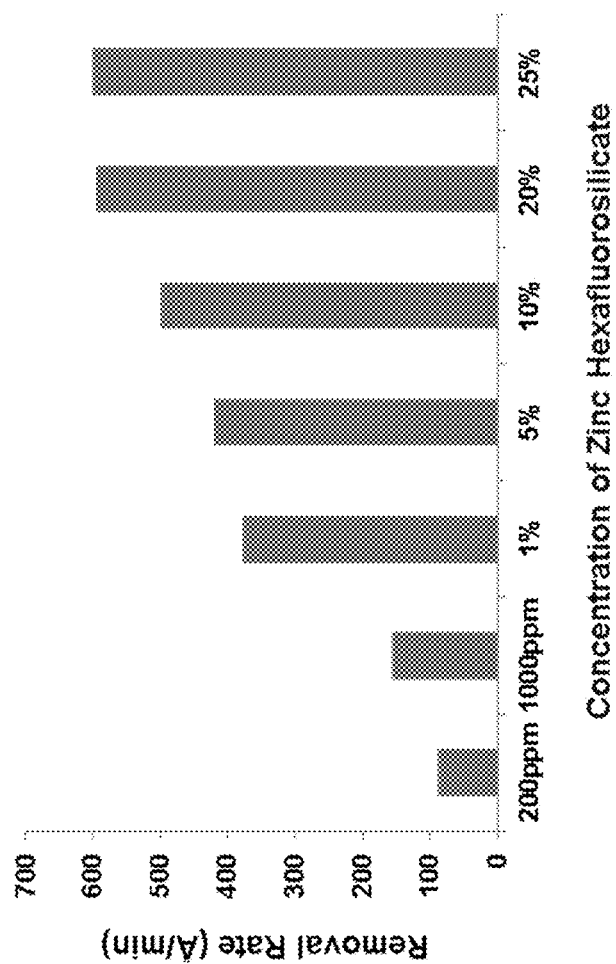
FIG. 3 shows removal rates under different concentrations of the Lewis acid.

A further experiment is conducted with a series of concentrations of the Lewis acid. Different amount of zinc hexafluorosilicate is dissolved in deionized water to form the concentration listed in Table 3 below, and is used to polish a respective plasma-enhanced tetraethyl-orthosilicate (PE-TEOS) oxide (OX) wafer. The polishing condition generally follows the specified CMP tool recipe and condition for 8" and 12" wafer, as shown in Table 2 above. The result is shown in Table 3 below and FIG. 3.

TABLE 3

The removal rate under different concentrations of the Lewis acid

| Conc. of Zinc Hexafluorosilicate | Removal rate (Å/min) |
|---|---|
| 200 ppm | 89 |
| 1000 ppm | 156 |
| 1 wt % | 377 |
| 5 wt % | 421 |
| 10 wt % | 499 |
| 20 wt % | 596 |
| 25 wt % | 602 |

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical polishing (CMP) process, comprising:
   providing a silicon substrate, wherein a material of the silicon substrate is selected from the group consisting of $Si_3N_4$ or $SiO_x$, and x is greater than 0 but not greater than 2; and
   polishing the silicon substrate with a CMP slurry and without an abrasive to remove at least a portion of the material of the silicon substrate, wherein the CMP slurry comprises:
   a Lewis acid which is in dissolved form, wherein the Lewis acid is zinc bromide.

2. The CMP process of claim 1, wherein the CMP slurry further comprises a solvent, and the Lewis acid is dissolved in the solvent.

3. The CMP process of claim 1, wherein the Lewis acid has an affinity with an oxygen atom of a Si—O bond in silicon oxide, and the affinity is stronger than a bond strength of the Si—O bond in silicon oxide.

4. The CMP process of claim 1, wherein the Lewis acid has an affinity with a nitrogen atom of a Si—N bond in silicon nitride, and the affinity is stronger than a bond strength of the Si—N bond in silicon nitride.

5. The process of claim 1, wherein the CMP slurry further comprises an oxidant, a PH adjustor, a surfactant or a water-soluble lubricant.

6. The CMP process of claim 1, wherein the CMP slurry consists of one phase of matter.

7. The CMP process of claim 1, wherein a mass fraction of the Lewis acid in the slurry is about 10 ppm to about 50 wt %.

* * * * *